(12) United States Patent
Morimoto et al.

(10) Patent No.: US 9,433,136 B2
(45) Date of Patent: Aug. 30, 2016

(54) ANECHOIC CHAMBER BOX FOR STORING ELECTRONIC APPARATUS

(71) Applicant: NTT Resonant Technology Inc., Tokyo (JP)

(72) Inventors: Kyohei Morimoto, Tokyo (JP); Toshiya Kurishima, Tokyo (JP); Kazuya Tsunda, Tokyo (JP)

(73) Assignee: NTT RESONANT TECHNOLOGY INC., Tokyo (JP)

( * ) Notice: Subject to any disclaimer, the term of this patent is extended or adjusted under 35 U.S.C. 154(b) by 0 days.

(21) Appl. No.: 14/363,624

(22) PCT Filed: Oct. 3, 2013

(86) PCT No.: PCT/JP2013/076943
§ 371 (c)(1),
(2) Date: Jun. 6, 2014

(87) PCT Pub. No.: WO2015/049760
PCT Pub. Date: Apr. 9, 2015

(65) Prior Publication Data
US 2016/0212891 A1    Jul. 21, 2016

(51) Int. Cl.
*H05K 9/00* (2006.01)
*H05K 5/02* (2006.01)
*H01Q 17/00* (2006.01)
*H05K 7/20* (2006.01)

(52) U.S. Cl.
CPC ............ *H05K 9/0007* (2013.01); *H01Q 17/00* (2013.01); *H05K 5/0247* (2013.01); *H05K 7/20145* (2013.01)

(58) Field of Classification Search
CPC ............ G06F 1/16; G06F 1/18; G06F 1/181; G06F 1/1601; G06F 2200/1631; G06F 2200/1638; G06F 1/1656; G06F 1/1671; G06F 1/187; G06F 2212/2112; G06F 12/1466; H05K 5/00; H05K 7/20136; H05K 2201/2027; H05K 7/1448; H05K 7/1474; H05K 9/0007; H05K 5/0247; H05K 7/20145; H01L 23/467; H01L 2224/75754; H01L 2224/80136; H01L 2224/80139; H01L 2224/81136; H01L 2224/81141; H01L 2224/83136; H01L 2224/84136; F21V 29/40; F21V 29/67; G02F 1/133385; H01Q 17/00
USPC ............ 361/679.01–679.02, 679.46–679.5, 361/688–727; 312/223.1–223.3, 223.6; 174/520–565; 211/26
See application file for complete search history.

(56) References Cited

U.S. PATENT DOCUMENTS 5,594,446 A * 1/1997 Vidmar .................. H01Q 1/366
                                                                        342/1
2005/0280340 A1* 12/2005 Brustle .............. A47B 88/0044
                                                                       312/348.4

(Continued)

FOREIGN PATENT DOCUMENTS

JP     1993-050778      7/1993
JP     H10-275994 A    10/1998

(Continued)

*Primary Examiner* — Anthony Haughton
*Assistant Examiner* — Yahya Ahmad
(74) *Attorney, Agent, or Firm* — Polsinelli PC (57) ABSTRACT

Both a forward direction and a rearward direction of storage racks $20_{-1}$ and $20_{-2}$ are set to be opening portions 23 and intake and exhaust ducts $61_{-1}$, $61_{-2}$, $62_{-1}$ and $62_{-2}$ are provided on doors 11a and 11b in the forward direction and the rearward direction of a storage container 10. Consequently, a ventilation passage linked to an outside from a wall surface in the forward direction of the storage container 10 via a wall surface in the rearward direction is formed for each of storage shelves $31_{-i}$ and $32_{-i}$ of the storage racks $20_{-1}$ and $20_{-2}$ so that heat generated from an electronic apparatus can be efficiently discharged to an outside of the storage container 10, and furthermore, the storage container 10 itself is configured to be isolated electrically by a radio wave absorber so that a function of an anechoic chamber can also be ensured.

6 Claims, 4 Drawing Sheets

(56) References Cited

U.S. PATENT DOCUMENTS

| | | | | |
|---|---|---|---|---|
| 2012/0113582 A1* | 5/2012 | Hirano | ............... | G06F 1/187 361/679.33 |
| 2013/0251483 A1* | 9/2013 | Kobayashi | ............ | C12M 23/48 414/282 |
| 2014/0354463 A1* | 12/2014 | Hirose | ............... | H05K 9/009 342/1 |

FOREIGN PATENT DOCUMENTS

| | | |
|---|---|---|
| JP | H10-295007 A | 11/1998 |
| JP | H11-196943 A | 7/1999 |
| JP | 2003-249778 A | 9/2003 |
| JP | 2003-259923 A | 9/2003 |
| JP | 2005-209702 A | 8/2005 |
| JP | U3114421 | 8/2005 |
| JP | 2007-214443 A | 8/2007 |
| JP | 2007-234998 A | 9/2007 |
| JP | 2007-330564 A | 12/2007 |
| JP | 2008-228763 A | 10/2008 |
| JP | 2009-050327 A | 3/2009 |
| JP | 2009-135016 A | 6/2009 |
| JP | 2009-224416 A | 10/2009 |
| WO | WO-2007-034869 A1 | 3/2007 |

\* cited by examiner

333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333333# ANECHOIC CHAMBER BOX FOR STORING ELECTRONIC APPARATUS

CROSS REFERENCE TO RELATED APPLICATIONS

This application is a National Phase filing under 35 U.S.C. §371 of PCT/JP2013/079943 filed on Oct. 3, 2013, the entire contents of which are hereby incorporated by reference.

TECHNICAL FIELD

The present invention relates to an anechoic chamber box for storing electronic apparatuses and more particularly to a storage box capable of storing a plurality of electronic apparatuses which emit a radio wave to prevent the radio wave from leaking to an outside.

BACKGROUND ART

In recent years, a smart phone spreads rapidly in place of a portable telephone of a conventional type. As one of attractions of the smart phone, a user can freely download and utilize various applications (hereinafter referred to as smart phone applications).

However, the smart phone is provided with various OS such as Android (a registered trademark), iPhone iOS (iPhone is a registered trademark), BlackBerry OS (BlackBerry is a registered trademark), Windows Phone 8 (Windows Phone is a registered trademark) and the like, and models are increased more greatly than before. Such an environment is a great worry to traders engaged in development or verification of the smart phone applications. The reason is that cost is increased excessively if they purchase all of models sold successively every time.

In consideration of the actual circumstances, a rental service for a smart phone is provided. A rental type includes a type for lending an actual machine of a smart phone to application developers, a type for enabling a smart phone to be utilized in a rental room, and furthermore, a type (a remote rental service) for enabling a smart phone to be utilized by giving remote access via internet.

Referring to the remote rental service, there is provided a function for specifying a desirable smart phone application to carry out remote installation into a smart phone, thereby performing remote control such as execution of various commands or debugging. By utilizing the remote rental service, it is possible to reduce cost for purchasing an expensive terminal, and furthermore, to omit a troublesome preparation work such as charge of the smart phone or driver installation. The remote rental service is expected to be practically used widely in the future because of high utility value.

It is a matter of course that service traders offering the remote rental service needs to prepare a large number of smart phones having each OS and each model. For this reason, it is necessary to ensure a space for storing these smart phones. A large number of smart phones are to be prepared. Therefore, it is desirable to develop a box capable of storing a large number of smart phones in a saved space. It is necessary to properly take out the stored smart phone in order to carry out charging or maintenance. For this reason, it is demanded to simply enable a large number of smart phones to be stored, and furthermore, to easily put them in/out.

In consideration of the simultaneous operation of the large number of smart phones, furthermore, it is indispensable to have a structure of a radio wave anechoic chamber which electrically isolates a box in order not to influence an outside of the box by a radio wave emitted from the smart phone. The problem is not restricted to the radio wave. Since a temperature of an inner part of the box is raised considerably by heat generated by the large number of smart phones, it is necessary to derive a way for discharging the heat to the outside. In addition, it is also necessary to wire the large number of smart phones from the outside of the box to an inside thereof. In other words, there is a peculiar subject in that it is necessary to ensure the structure of the anechoic chamber while taking a measure against heat radiation and performing the wiring.

The storage tool capable of easily putting an article in/out is proposed conventionally (for example, see Patent Documents 1 and 2). The floor cabinet described in the Patent Document 1 has the structure in which the drawer provided in the lower part of the cabinet body is freely put in/out in the longitudinal direction, and furthermore, the storage shelf which is movable in the vertical direction is stored in the drawer.

Referring to the storage tool described in the Patent Document 2, when the storage box is to be pulled out of the storage cabinet, the hinge attached to the side plate of the storage box is slid along the shape of the rail attached to the side plate of the storage cabinet together with the storage box. Then, the storage box is rotated with the hinge set as a fulcrum and the storage box is completely pulled out toward the outside of the storage cabinet so that the storage box can be revolved at almost 360°.

Moreover, there is also proposed the storage tool intended for implementing a large amount of storage with space saving (for example, see the Patent Documents 3 and 4). The storage device described in the Patent Document 3 1380765485223_0.aspx?Time=20130918100816247#_ relates to a storage device in which the storage portion is disposed in two front and rear stages in the box-shaped body and has an object to set a dead space to be substantially zero, and left and right rear storage boxes can be longitudinally moved by the upper and lower rails and the front storage box is suspended and held by means of a bearing on the rail of the corresponding rear storage box. In the state in which the front and rear storage boxes on the left or right side are forward pulled out, consequently, it is possible to move the front storage box on the right or left side to this side of the front storage box on the left or right side which is adjacent thereto.

The slide type many-sided cabinet described in the Patent Document 4 has an object to utilize a small space without any waste and to enable storage depending on usability, and has the front storage portion to be opened in the direction of the front surface (the forward direction) and the rear storage portion to be opened at the side surface in at least one direction (the transverse direction) of the cabinet which is pulled out.

Moreover, the storage tool devised in relation to the wiring is also proposed (for example, see Patent Documents 5 and 6).
1380765485223_1.aspx?Time=20130918094933328#_
The storage unit described in the Patent Document 5 includes the drawers arranged in the vertical direction, the base cabinet capable of slidably storing the drawers, the drive units arranged in the vertical direction in the rear parts of the drawers, and the plate-shaped longitudinal bracket erected with the drive units supported collectively, and the longitudinal bracket has the wiring gap between the upper end and the top plate of the base cabinet.

Referring to the control device described in the Patent Document 6, the inner part of the storage box is divided into a plurality of portions, and the drawer shelf which is pulled out of the opening portion of the front surface of the storage box and can freely carry out storage is provided every divided box portion. The respective apparatuses are divided and disposed on the drawer shelves, and furthermore, the respective apparatuses are connected through separable connectors from each other and the external connector for relaying the input/output of the external device and the predetermined apparatus is provided on the wall surface of the storage box. Consequently, a mounting and wiring work in the apparatus can be carried out at the outside of the storage box. Furthermore, the work for wiring the apparatuses can be performed without time and labor after the storage of the drawer shelf.

Patent Document 1: Japanese Laid-Open Patent Publication No. 2007-330564

Patent Document 2: Japanese Laid-Open Patent Publication No. 1999-196943

Patent Document 3: Japanese Laid-Open Patent Publication No. 2003-259923

Patent Document 4: Japanese Laid-Open Patent Publication No. 2008-228763

Patent Document 5: Japanese Laid-Open Patent Publication No. 2009-50327

Patent Document 6: Japanese Laid-Open Patent Publication No. 1998-295007

DISCLOSURE OF THE INVENTION

Although the storage tools described in the Patent Documents 1 to 6 are devised to effectively utilize a saved space without any waste, to easily put in/out a thing to be stored, and to perform wiring in the storage of an electronic apparatus, however, it is impossible to configure a box for storing an electronic apparatus which functions as an anechoic chamber even if these devised techniques are combined with each other.

In other words, it is necessary to ensure the structure of the anechoic chamber isolated electrically while taking a measure against heat radiation for discharging, to an outside, heat generated from the electronic apparatuses stored in the storage box and devising the wiring which takes easiness of a work such as charging or maintenance into consideration. However, there is a problem in that this cannot be implemented even if the techniques described in the Patent Documents 1 to 6 are combined with each other.

The present invention has been made to solve the problem and has an object to provide a storage box capable of storing a large number of electronic apparatuses in a saved space and easily putting in/out them, and functioning as an anechoic chamber isolated electrically while taking a measure against heat radiation or devising wiring.

In order to attain the object, an anechoic chamber box for storing an electronic apparatus according to the present invention includes a storage container which is a housing on an outermost side and has a wall surface configured by a radio wave absorber, a plurality of storage racks stored side by side in a first direction in the storage container and having an opening portion in both forward and rearward directions of the first direction, a plurality of storage shelves provided with a division into a plurality of stages in the storage rack and enabled to be individually pulled out from the opening portion in the forward direction in the first direction, a wiring device provided in the storage rack and having a plurality of cables to be connected to a plurality of electronic apparatuses placed on the storage shelves, an air cooling fan provided on at least one of a wall surface in the forward direction and a wall surface in the rearward direction in the first direction of the storage container, and a duct provided on at least the other of the wall surface in the forward direction and the wall surface in the rearward direction in the first direction of the storage container, and when a door in the first direction of the storage container is opened, the storage racks are integrally pulled out in the first direction and at least one of the storage racks can be then slid individually in a second direction which is different from the first direction, and the storage racks have a wiring passage for wiring the cables to the storage shelves at inner side surfaces thereof, respectively.

According to the present invention having the structure described above, the storage racks stored in the storage container are pulled out in the first direction and the desirable storage rack is then slid in the second direction if necessary, and the desirable storage shelf is further pulled out in the first direction so that the electronic apparatus can be put in/out. Moreover, the cable to the electronic apparatuses placed on the storage shelves is wired from the wiring device via the wiring passage provided on the inner side surface of the storage rack. Therefore, the cable is not an obstacle when the storage racks are to be pulled out in the first direction, when the desirable storage rack is to be slid in the second direction and when the desirable storage shelf is to be pulled out in the first direction. Consequently, a large number of electronic apparatuses can be stored in a saved space in the storage container and a desirable one of the electronic apparatuses can easily be put in/out.

According to the present invention, furthermore, both of the forward direction and the rearward direction in the first direction of the storage rack are set to be the opening portions, and the air cooling fan is provided on at least one of the wall surface in the forward direction and the wall surface in the rearward direction in the first direction of the storage container storing the storage rack and the duct is provided on at least the other. Consequently, it is possible to form the ventilation passage linked to the outside from the wall surface in the forward direction of the storage container via the wall surface in the rearward direction for each of the storage shelves of the storage racks. Thus, it is possible to efficiently discharge heat generated from the electronic apparatus to the outside of the storage container.

Furthermore, the storage container itself is configured from a radio wave absorber. Therefore, the electronic apparatuses placed on the storage shelves in an inner part are electrically isolated so as not to be influenced by a radio wave sent from the outside and as to prevent leakage, to the outside, of the radio wave generated from the electronic apparatuses placed on the storage shelves in the inner part. Consequently, it is also possible to ensure a function of an anechoic chamber.

BEST MODE FOR CARRYING OUT THE INVENTION

Figure 1:
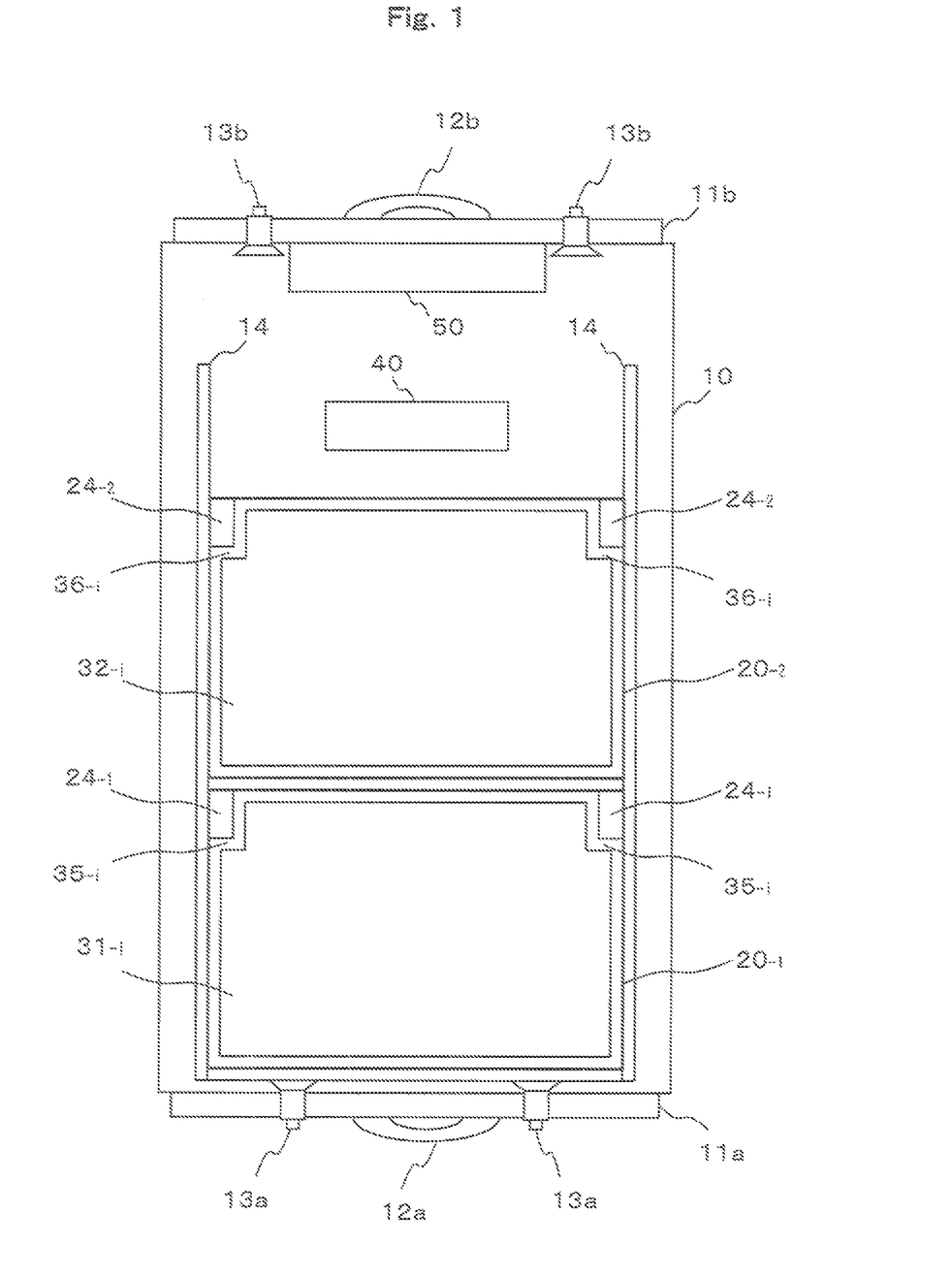
FIG. 1 is a schematic view showing a state in which an anechoic chamber box for storing electronic apparatuses according to the present embodiment is seen from above (a state in which storage racks are stored in a storage container).
Figure 2:
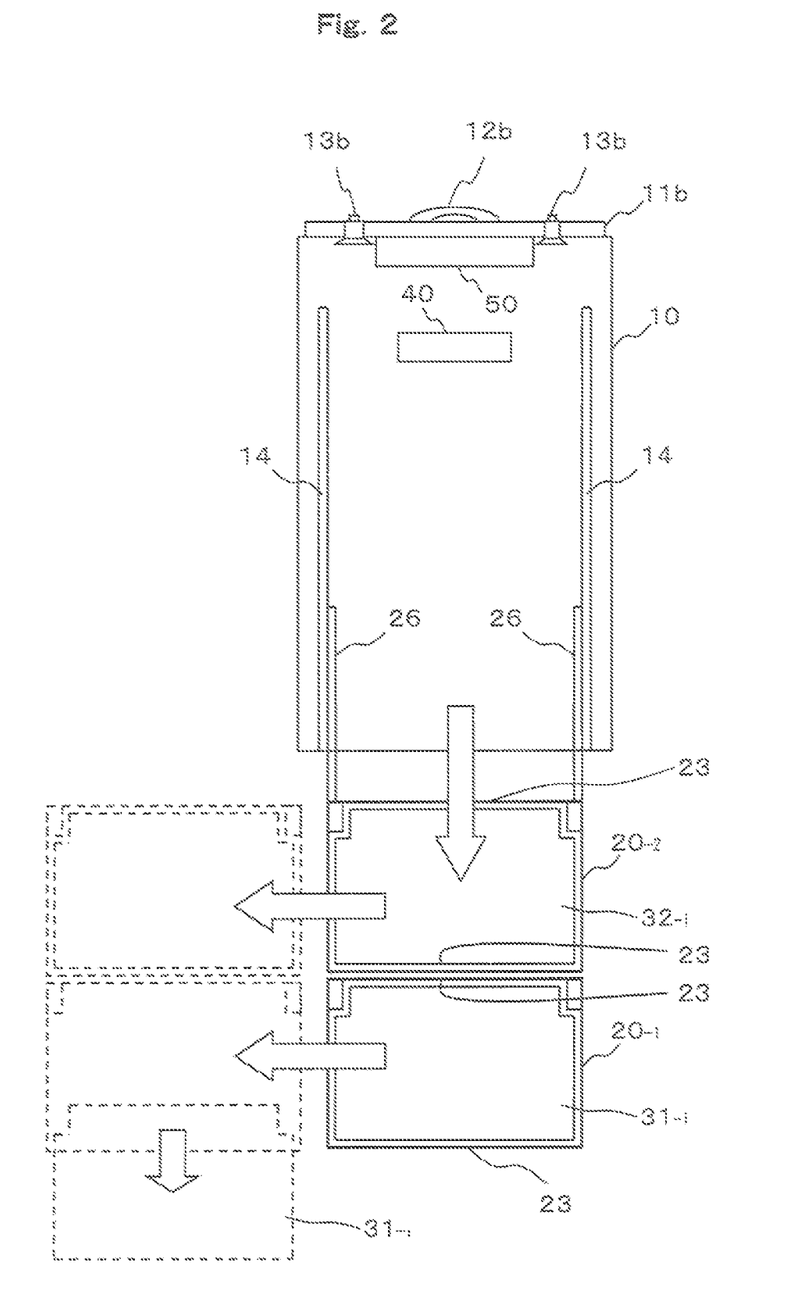
FIG. 2 is a schematic view showing a state in which the anechoic chamber box for storing electronic apparatuses according to the present embodiment is seen from above (a state in which the storage racks are pulled out of the storage container and a storage shelf is further pulled out of the storage rack).

An embodiment according to the present invention will be described below with reference to the drawings. FIGS. 1 and 2 are schematic views showing an anechoic chamber box for storing electronic apparatuses according to the present embodiment as seen from above. Both of them virtually show a state in which an inner part is seen through from above. FIG. 1 shows a state in which storage racks to be described below are stored in a storage container, and FIG. 2 shows a state in which the storage racks are pulled out of the storage container and a storage shelf is further pulled out of the storage rack. It is assumed that a downward direction in the drawing indicates a front side and an upward direction in the drawing indicates a rear side.

Figure 3:
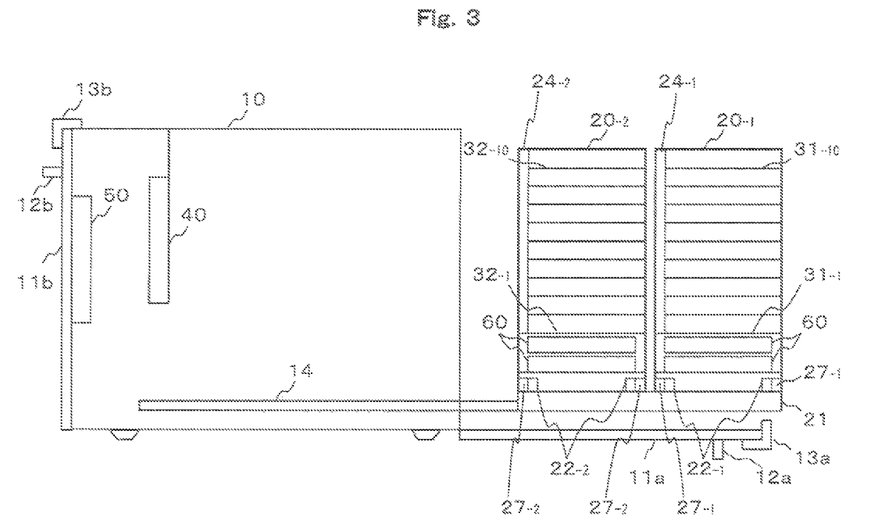
FIG. 3 is a schematic view showing a state in which the anechoic chamber box for storing electronic apparatuses according to the present embodiment is seen from a side (a state in which the storage racks are pulled out of the storage container).

Moreover, FIG. 3 is a schematic view showing the anechoic chamber box for storing electronic apparatuses according to the present embodiment as seen from a side, illustrating the state in which the storage racks are pulled out of the storage container. FIG. 3 virtually shows a state in which the inner part is seen through from a side. In FIG. 3, a rightward direction indicates a front side and a leftward direction indicates a rear side.

As shown in FIGS. 1 to 3, the anechoic chamber box for storing electronic apparatuses according to the present embodiment includes a storage container 10 to be a housing at an outermost side, a plurality of (two in the present embodiment) storage racks $20_{-1}$ and $20_{-2}$ stored side by side in a first direction (a longitudinal direction) in the storage container 10, and a plurality of (ten in the present embodiment) storage shelves $31\text{-}i$ and $32\text{-}i$ (i=1, 2, . . . , 10) provided with a division into plural stages in the storage racks $20_{-1}$ and $20_{-2}$.

Doors 11a and 11b are provided in forward and rearward directions of the storage container 10 respectively, and the doors 11a and 11b are provided with holding portions 12a and 12b and lock mechanisms 13a and 13b respectively. The storage container 10 is configured from a radio wave absorber using a radio wave absorbing material such as iron, nickel or ferrite. When the doors 11a and 11b are closed and are thus locked by the lock mechanisms 13a and 13b, the electronic apparatuses (a smart phone, a tablet, a notebook PC or the like) stored in an inner part are electrically isolated so as not to be influenced by a radio wave sent from an outside and as to prevent a radio wave emitted from the electronic apparatuses from leaking to the outside.

As shown in FIGS. 1 and 2, a bottom surface of the storage container 10 includes a set of rails 14 which is provided in the first direction. On the other hand, as shown in FIG. 3, the storage racks $20_{-1}$ and $20_{-2}$ are provided side by side in a longitudinal direction over a single base table 21. The base table 21 has a set of rails 26 to be engaged with the rails 14, and can be slid in the longitudinal direction along the rails 14. When the door 11a provided in the forward direction of the storage container 10 is opened, consequently, the storage racks $20_{-1}$ and $20_{-2}$ can be integrally pulled out in the forward direction.

As shown in FIG. 3, moreover, the base table 21 includes two sets of rails $22_{-1}$ and $22_{-2}$ which are provided in a second direction (a transverse direction) that is different from the first direction. On the other hand, the storage racks $20_{-1}$ and $20_{-2}$ have two sets of rails $27_{-1}$ and $27_{-2}$ to be engaged with the rails $22_{-1}$ and $22_{-2}$. Consequently, the storage racks $20_{-1}$ and $20_{-2}$ can be slid in the transverse direction along the rails $22_{-1}$ and $22_{-2}$. In other words, as shown in FIG. 2, the storage racks $20_{-1}$ and $20_{-2}$ are integrally pulled out in the forward direction and can be then slid individually in the leftward direction.

The storage racks $20_{-1}$ and $20_{-2}$ have an opening portion 23 provided in both the forward direction and the rearward direction. A plurality of storage shelves $31_{-i}$ and $32_{-i}$ provided on the storage racks $20_{-1}$ and $20_{-2}$ respectively can be individually pulled forward out of the opening portion 23 in the forward direction. One electronic apparatus or more can be placed on one of the storage shelves. For example, one electronic apparatus can be placed if the electronic apparatus is a notebook PC, and the electronic apparatuses can be placed on the single storage shelf if the electronic apparatuses are smart phones or tablets.

An illumination device 40 such as an LED is provided in a space between a wall surface of the door 11b provided in the rearward direction of the storage container 10 and the storage rack $20_{-2}$. This serves to enable verification as to whether camera photographing is carried out by electronic apparatuses through a remote operation without problems or not. For example, the illumination device 40 is configured from plural types of LEDs having various luminescence colors, and they are alternately turned ON or flashed.

A wireless access point 50 is provided on the wall surface of the door 11b disposed in the rearward direction of the storage container 10. The wireless access point 50 is used in wireless communication of the electronic apparatuses placed on the storage shelves $31_{-i}$ and $32_{-i}$. The door 11b provided in the rearward direction of the storage container 10 can be opened when maintenance of the illumination device 40 or the wireless access point 50 or the like is performed.

Figure 4:
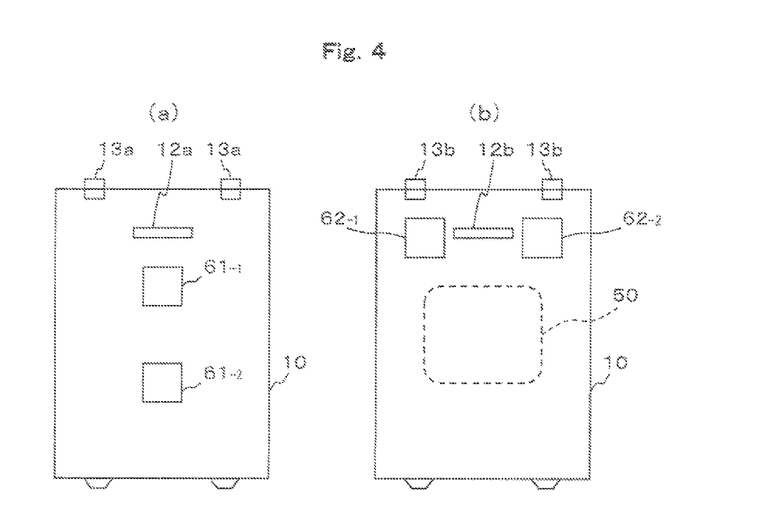
FIG. 4 is a view showing an example of a structure of ducts according to the present embodiment.

An air cooling fan is provided on at least one of the wall surface of the door 11a disposed in the forward direction and the wall surface of the door 11b disposed in the rearward direction in the storage container 10, and ducts are provided on at least the other wall surface. FIG. 4 is a view showing an example of structures of the air cooling fan and the ducts. FIG. 4(a) is a front view showing the storage container 10 seen in the forward direction and FIG. 4(b) is a back view showing the storage container 10 seen in the rearward direction.

As shown in FIG. 4, in the present embodiment, two ducts $61_{-1}$ and $61_{-2}$ are provided on the door 11a in the forward direction of the storage container 10 and two ducts $62_{-1}$ and $62_{-2}$ are provided on the door 11b in the rearward direction. The two ducts $61_{-1}$ and $61_{-2}$ in the forward direction are provided at a regular interval in the vertical direction. On the other hand, the two ducts $62_{-1}$ and $62_{-2}$ in the rearward direction are provided at a regular interval in the transverse direction to keep away from a position in which the wireless access point 50 is disposed.

All of the four ducts $61_{-1}$, $61_{-2}$, $62_{-1}$ and $62_{-2}$ take a square sectional shape. One of them is a duct fan having a built-in exhaust fan. For example, the duct $62_{-1}$ provided on the door 11b in the rearward direction of the storage container 10 is a duct fan including an exhaust fan, the residual duct $62_{-2}$ is an exhaust duct, and the two ducts $61_{-1}$ and $61_{-2}$ provided on the door $11a$ in the forward direction function as intake ducts.

It is preferable that sizes of the ducts $61_{-1}$, $61_{-2}$, $62_{-1}$ and $62_{-2}$ should be set to be sizes other than integer times of wavelengths of radio waves emitted from the electronic apparatuses. For example, in the case in which wireless communication is performed by using a radio wave in a 2.4 GHz or 5 GHz band between the electronic apparatuses and the wireless access point 50, a length of one of sides in each of the ducts $61_{-1}$, $61_{-2}$, $62_{-1}$ and $62_{-2}$ is designed so as not to be equal to the integer times of the wavelength which corresponds to the frequency. Consequently, the wavelengths of the radio waves emitted from the electronic apparatuses are not caused to be resonant with the sizes of the ducts $61_{-1}$, $61_{-2}$, $62_{-1}$ and $62_{-2}$. Thus, it is possible to prevent the radio waves from leaking to the outside of the storage container 10 due to the resonance of the radio wave through the ducts $61_{-1}$, $61_{-2}$, $62_{-1}$ and $62_{-2}$.

Figure 5:
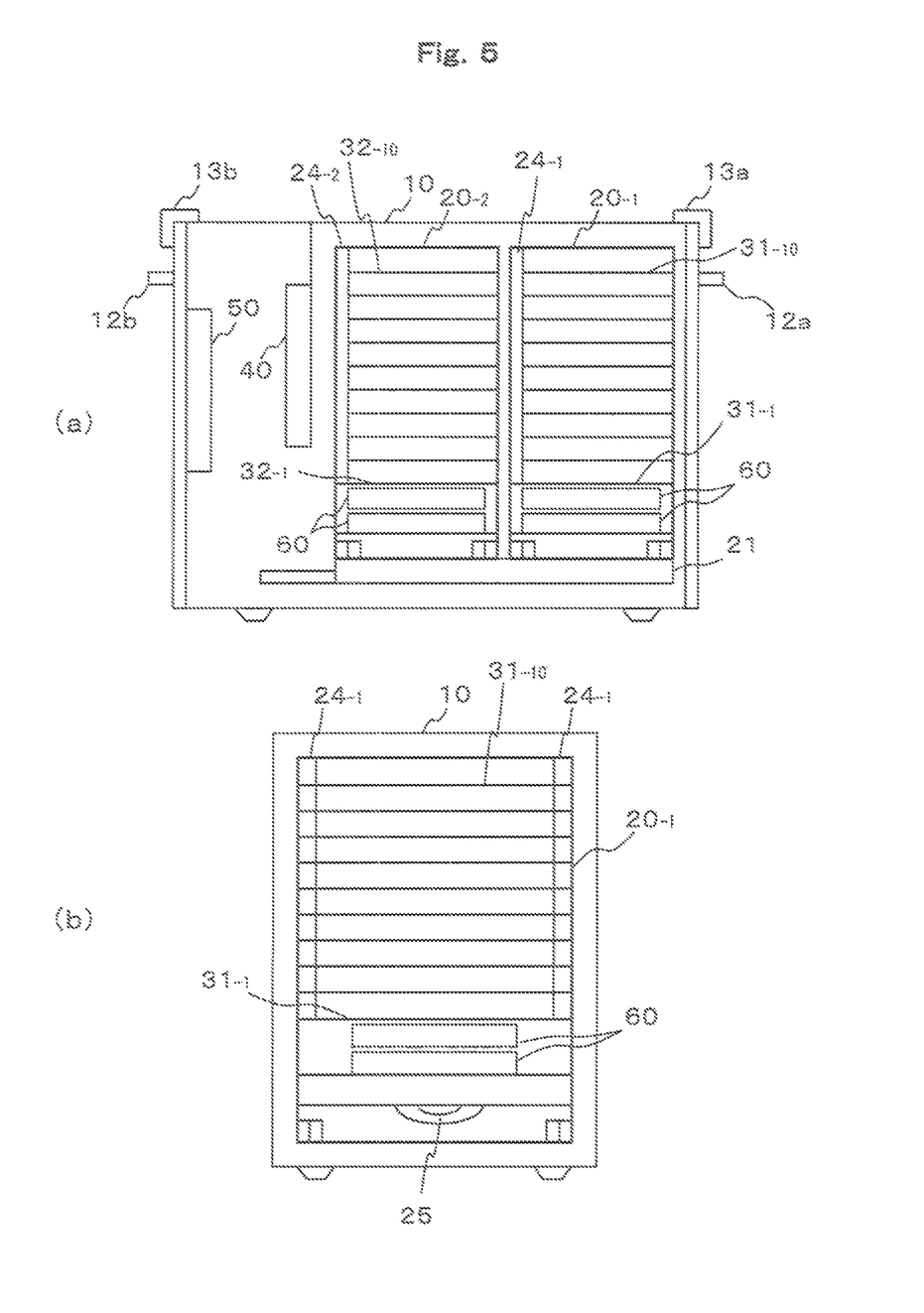
FIG. 5 is a view for explaining wiring in the storage container according to the present embodiment.

FIG. 5 is a view for explaining wiring in the storage container 10. FIG. 5(a) is a schematic view showing the anechoic chamber box for storing electronic apparatuses according to the present embodiment as seen from a side, and FIG. 5(b) is a schematic view seen from a front (a forward direction). FIG. 5(a) virtually shows a state in which an inner part is seen through from the side. On the other hand, FIG. 5(b) shows an actual seen state from the front. The reference numeral 25 shown in FIG. 5(b) denotes a holding portion to be used in the pull-out of the storage racks $20_{-1}$ and $20_{-2}$ in the forward direction.

As shown in FIG. 5, a plurality of wiring devices 60 are provided in lowermost parts of the storage racks $20_{-1}$ and $20_{-2}$, that is, lower parts of the storage shelves $31_{-1}$ and $32_{-1}$ in lowermost stages. The wiring devices 60 have a plurality of cables (for example, USB cables) to be connected to the electronic apparatuses placed on the storage shelves $31_{-i}$ and $32_{-i}$. Moreover, the wiring devices 60 may have a power cable or an LAN cable to the illumination device 40 and the wireless access point 50.

A wiring for the power cable or the LAN cable from the outside of the storage container 10 to the wiring devices 60 on an inside is carried out through a hole (not shown) provided in one place of the door $11b$ in the rearward direction of the storage container 10, for example. The hole is subjected to ground processing and radio wave shielding means for filling a gap by using a radio wave absorber utilizing a radio wave absorbing material. The power cable or the LAN cable to the illumination device 40 and the wireless access point 50 is not connected via the wiring devices 60 but may be directly connected via a separately provided hole.

Moreover, the storage racks $20_{-1}$ and $20_{-2}$ include wiring passages $24_{-1}$ and $24_{-2}$ for wiring the cables possessed by the wiring devices 60 to the storage shelves $31_{-i}$ and $32_{-i}$ at inside surfaces, respectively. As shown in FIGS. 5(b) and 1, each of the wiring passages $24_{-1}$ and $24_{-2}$ is provided on each of both left and right side surfaces of each of the storage racks $20_{-1}$ and $20_{-2}$. The wiring passages $24_{-1}$ and $24_{-2}$ are hollow and a hole (not shown) is formed in a position of each stage having the storage shelves $31_{-i}$ and $32_{-i}$, and the cable can be led to the outside therefrom.

As shown in FIG. 1, moreover, holes $35_{-i}$ and $36_{-i}$ are formed on the storage shelves $31_{-i}$ and $32_{-i}$, respectively. The holes $35_{-i}$ and $36_{-i}$ serve to insert the cable passing through the wiring passages $24_{-1}$ and $24_{-2}$ therein. The cables led from the cavities of the wiring passages $24_{-1}$ and $24_{-2}$ to the outside via the holes in the respective stages are inserted through the holes $35_{-i}$ and $36_{-i}$ of the storage shelves $31_{-i}$ and $32_{-i}$ and are thus connected to terminala of the electronic apparatuses.

As described above in detail, according to the anechoic chamber box for storing electronic apparatuses in accordance with the present embodiment having the structure, the storage racks $20_{-1}$ and $20_{-2}$ stored in the storage container 10 are pulled out in the forward direction and a desired one of them is then slid in the leftward direction if necessary, and furthermore, a desired one of the storage shelves $31_{-i}$ and $32_{-i}$ is led out in the forward direction so that the electronic apparatuses can be put in/out.

Moreover, the cables to the electronic apparatuses placed on the storage shelves $31_{-i}$ and $32_{-i}$ are wired from the wiring devices 60 through the wiring passages $24_{-1}$ and $24_{-2}$ provided on the inside surfaces of the storage racks $20_{-1}$ and $20_{-2}$. Therefore, the cables are not an obstacle when the storage racks $20_{-1}$ and $20_{-2}$ are led out in the forward direction, when the desirable storage rack $20_{-1}$ or $20_{-2}$ is slid in the leftward direction and when the desirable storage shelf $31_{-i}$ or $32_{-i}$ is pulled out in the forward direction.

As described above, according to the anechoic chamber box in accordance with the present embodiment, a large number of electronic apparatuses are stored in the saved space in the storage container 10 and a desirable one of the electronic apparatuses can easily be put in/out.

According to the anechoic chamber box in accordance with the present embodiment, moreover, the opening portions 23 are provided in both of the forward and rearward directions of the storage racks $20_{-1}$ and $20_{-2}$ and the exhaust duct fan $62_{-1}$ is provided on the door $11b$ in the rearward direction in the storage container 10, and furthermore, the intake and exhaust ducts $61_{-1}$, $61_{-2}$ and $62_{-2}$ are provided on the door $11a$ in the forward direction and the door $11b$ in the rearward direction. Consequently, it is possible to form a ventilation passage linked to the outside from the wall surface in the forward direction of the storage container 10 via the wall surface in the rearward direction for each of the storage shelves $31_{-i}$ and $32_{-i}$ of the storage racks $20_{-1}$ and $20_{-2}$. Thus, it is possible to efficiently discharge heat generated from the electronic apparatuses to the outside of the storage container 10.

Furthermore, the storage container 10 itself is configured from the radio wave absorber and the electronic apparatuses placed on the storage shelves $31_{-i}$ and $32_{-i}$ in the inner part are electrically isolated so as not to be influenced by the radio wave sent from the outside and as to prevent leakage, to the outside, of the radio waves generated from the electronic apparatuses. Referring to the wiring of the cables to the electronic apparatuses placed on the storage shelves $31_{-i}$ and $32_{-i}$, moreover, a wiring portion from the outside of the storage container 10 to the inside thereof (the hole provided in one place on the door $11b$ in the rearward direction) is subjected to the radio wave shielding means so that the radio wave can be sufficiently prevented from leaking. In addition, all of the sizes of the ducts $61_{-1}$, $61_{-2}$, $62_{-1}$ and $62_{-2}$ formed for air cooling in the storage container 10 are set to be the sizes other than the integer times of the wavelengths of the radio waves emitted from the electronic apparatuses, and the radio waves are prevented from leaking to the outside of the storage container 10 due to amplification through the ducts $61_{-1}$, $61_{-2}$, $62_{-1}$ and $62_{-2}$. Consequently, the anechoic chamber box according to the present embodiment can sufficiently exhibit the function of the anechoic chamber.

According to the anechoic chamber box in accordance with the present embodiment, thus, it is possible to store a large number of electronic apparatuses in a saved space and easily put them in/out and to function as an electrically isolated anechoic chamber while taking a measure against heat radiation and devising wiring.

Although the description has been given to the example in which two storage racks $20_{-1}$ and $20_{-2}$ and ten storage shelves $31_{-i}$ and $32_{-i}$ are provided in the embodiment, the numbers are only illustrative.

Although the description has been given to the example in which the rails 14 and 26 are provided as the structure for enabling the storage racks $20_{-1}$ and $20_{-2}$ to be moved in the forward direction and the rails $22_{-1}$, $22_{-2}$, $27_{-1}$ and $27_{-2}$ are provided as the structure for enabling the storage racks $20_{-1}$ and $20_{-2}$ to be moved in the leftward direction in the embodiment, moreover, the moving mechanism is not restricted to the structure in the present invention.

The description has been given to the structure for enabling both of the two storage racks $20_{-1}$ and $20_{-2}$ to be slid in the leftward direction in the embodiment, furthermore, the present invention is not restricted thereto. In other words, it is also possible to slide only one of them in the leftward direction. For example, the storage shelves $31_{-i}$ provided in the storage rack $20_{-1}$ in the forward direction can be pulled out in the forward direction even if the storage rack $20_{-1}$ is not slid in the leftward direction.

Accordingly, it is also possible to have a structure in which only the storage rack $20_{-2}$ in the rearward direction is slid in the leftward direction without having the structure in which the storage rack $20_{-1}$ in the forward direction is slid in the leftward direction. To the contrary, it is also possible to have a structure in which only the storage rack $20_{-1}$ in the forward direction is slid in the leftward direction without having the structure in which the storage rack $20_{-2}$ in the rearward direction is slid in the leftward direction. The reason is that the storage shelves $31_{-i}$ and $32_{-i}$ can be pulled out in the forward direction from any of the storage racks $20_{-1}$ and $20_{-2}$ if the storage rack $20_{-1}$ in the forward direction is slid in the leftward direction.

Moreover, it is possible to employ a structure in which at least one of the two storage racks $20_{-1}$ and $20_{-2}$ is pulled in an upward direction after they are moved in the forward direction. It is also possible to employ a structure in which the storage racks $20_{-1}$ and $20_{-2}$ are completely pulled out to be freely movable or a structure in which the storage racks $20_{-1}$ and $20_{-2}$ are pulled up by a predetermined height and can be locked so as not to fall by their dead loads in the case of the pull-up in the upward direction.

Although the description has been given to the example in which the illumination device 40 is provided in the space between the wall surface of the door 11b disposed in the rearward direction of the storage container 10 and the storage rack $20_{-2}$ in the embodiment, moreover, the present invention is not restricted thereto. For example, it is also possible to provide the illumination device 40 in the space between the wall surface of the door 11a disposed in the forward direction of the storage container 10 and the storage rack $20_{-1}$. In this case, however, the door 11b in the rearward direction is opened to pull out the storage racks $20_{-1}$ and $20_{-2}$ in the rearward direction.

Although the description has been given to the example in which the exhaust duct fan $62_{-1}$ is provided on the door 11b in the rearward direction and the intake and exhaust ducts $61_{-1}$, $61_{-2}$ and $62_{-2}$ are provided on the door 11a in the forward direction and the door 11b in the rearward direction in the embodiment, moreover, the present invention is not restricted thereto. For instance, the position in which the duct fan is to be provided may be disposed on the door 11a side in the forward direction. Moreover, the number of the ducts is not restricted to four. For example, a single duct fan may be provided on one of the door 11a in the forward direction and the door 11b in the rearward direction, and one duct may be provided on the other.

In addition, the embodiment is only illustrative for concreteness to carry out the present invention and the technical scope of the present invention should not be thereby construed to be restrictive. In other words, the present invention can be carried out in various configurations without departing from the gist or main features thereof.

EXPLANATION OF DESIGNATION 10 storage container
11a, 11b door
$20_{-1}$, $20_{-2}$ storage rack
23 opening portion
$24_{-1}$, $24_{-2}$ wiring passage
$31_{-i}$, $32_{-i}$ storage shelf
$35_{-i}$, $36_{-i}$ hole provided on storage shelf
40 illumination device
50 wireless access point
60 wiring device

The invention claimed is:

1. An anechoic chamber box for storing electronic apparatus comprising:
   a storage container which is a housing on an outermost side and has a wall surface configured by a radio wave absorber;
   a plurality of storage racks stored side by side in a first direction in the storage container and having an opening portion in both forward and rearward directions of the first direction;
   a plurality of storage shelves provided with a division into a plurality of stages in the storage rack and enabled to be individually pulled out from the opening portion in the forward direction in the first direction;
   a wiring device provided in the storage rack and having a plurality of cables to be connected to a plurality of electronic apparatuses placed on the storage shelves;
   an air cooling fan provided on at least one of a wall surface in the forward direction and a wall surface in the rearward direction in the first direction of the storage container; and
   a duct provided on at least the other of the wall surface in the forward direction and the wall surface in the rearward direction in the first direction of the storage container,
   wherein when a door in the first direction of the storage container is opened, the storage racks are integrally pulled out in the first direction and at least one of the storage racks can be then slid individually in a second direction which is different from the first direction, and
   the storage racks have a wiring passage for wiring the cables to the storage shelves at inner side surfaces thereof, respectively.

2. The anechoic chamber box for storing electronic apparatus according to claim 1, wherein a size of the duct is set to be a size other than integer times of a wavelength of a radio wave generated from the electronic apparatus.

3. The anechoic chamber box for storing electronic apparatus according to claim 1, wherein the cable is wired from an outside of the storage container to the wiring device at an inside via a hole provided in one place of the storage container, and the hole is subjected to radio wave shielding means.

4. The anechoic chamber box for storing electronic apparatus according to claim 1, wherein the storage shelves are provided with a hole for inserting the cable passing through the wiring passage therein.

5. The anechoic chamber box for storing electronic apparatus according to claim 1, wherein an illumination device is further provided in a space between one of the wall surface in the forward direction and the wall surface in the rearward direction in the first direction of the storage container and the storage rack.

6. The anechoic chamber box for storing electronic apparatus according to claim 1, wherein a wireless access point is further provided on one of the wall surface in the forward direction and the wall surface in the rearward direction in the first direction of the storage container.

\* \* \* \* \*